(12) United States Patent
Bose et al.

(10) Patent No.: US 9,485,884 B2
(45) Date of Patent: Nov. 1, 2016

(54) SET TOP BOX HAVING SNAP-IN HEAT SINK AND SMART CARD READER WITH A HOLD DOWN FOR RETAINING THE HEAT SINK

(75) Inventors: William Hofmann Bose, Nashville, TN (US); Mickey Jay Hunt, Camby, IN (US)

(73) Assignee: THOMSON LICENSING, Issy les Moulineaux (FR)

( * ) Notice: Subject to any disclaimer, the term of this patent is extended or adjusted under 35 U.S.C. 154(b) by 143 days.

(21) Appl. No.: 14/232,486

(22) PCT Filed: Jul. 12, 2012

(86) PCT No.: PCT/US2012/046466
§ 371 (c)(1),
(2), (4) Date: Mar. 28, 2014

(87) PCT Pub. No.: WO2013/009982
PCT Pub. Date: Jan. 17, 2013

(65) Prior Publication Data
US 2014/0198456 A1    Jul. 17, 2014

Related U.S. Application Data

(60) Provisional application No. 61/572,314, filed on Jul. 14, 2011.

(51) Int. Cl.
*H05K 7/12* (2006.01)
*H05K 7/20* (2006.01)

(52) U.S. Cl.
CPC ............. *H05K 7/12* (2013.01); *H05K 7/2039* (2013.01); *H05K 7/2049* (2013.01)

(58) Field of Classification Search
CPC ........ H05K 7/20; H05K 7/12; H05K 7/2039; H05K 9/00; H05K 5/00; H05K 5/02; H05K 7/2049; H01L 23/4093; G06F 1/20
USPC ........ 361/679.46, 679.54, 679.55, 702–724, 361/752; 165/80.2, 80.3, 104.33, 185; 174/50, 50.02, 16.1, 17 R, 252; 257/706–727, 737, 738, 778; 29/602.1, 29/841, 592.1, 832
See application file for complete search history.

(56) References Cited

U.S. PATENT DOCUMENTS 4,887,147 A    12/1989  Friedman
5,091,618 A    2/1992   Takahashi
(Continued)

FOREIGN PATENT DOCUMENTS

CN    1814339    8/2006
CN    1826046    8/2006
(Continued)

OTHER PUBLICATIONS

Search Report Dated: Oct. 8, 2012.
(Continued)

*Primary Examiner* — Michail V Datskovskiy
(74) *Attorney, Agent, or Firm* — Brian J. Dorini; Jerome G. Schaefer

(57) ABSTRACT

A hold down for an electronic device is provided that includes a bottom frame, a circuit board mounted above the bottom frame, a thermal pad mounted on the circuit board, and a heat sink associated with the thermal pad. The hold down includes a frame that defines a perimeter having a plurality of retainers that are configured to engage with a plurality of mating locations defined on at least a bottom frame to provide a biasing force that retains the heat sink against a circuit board that is positioned between the bottom frame and the hold down.

19 Claims, 9 Drawing Sheets

(56) References Cited

U.S. PATENT DOCUMENTS

| | | | |
|---|---|---|---|
| 5,402,309 A | 3/1995 | Ohgami et al. | |
| 5,620,242 A | 4/1997 | Leon et al. | |
| 5,667,397 A | 9/1997 | Broschard et al. | |
| 5,691,878 A * | 11/1997 | Ahn | H05K 5/0013 174/DIG. 2 |
| 5,917,236 A | 6/1999 | Leader, III et al. | |
| 6,021,044 A | 2/2000 | Neville, Jr. et al. | |
| 6,025,991 A | 2/2000 | Saito | |
| 6,049,469 A | 4/2000 | Hood et al. | |
| 6,212,074 B1 | 4/2001 | Gonsalves et al. | |
| 6,223,815 B1 | 5/2001 | Shibasaki | |
| 6,317,325 B1 * | 11/2001 | Patel | H05K 7/20445 165/185 |
| 6,382,995 B1 | 5/2002 | Bricaud et al. | |
| 6,411,507 B1 | 6/2002 | Akram | |
| 6,454,607 B2 | 9/2002 | Bricaud | |
| 6,524,361 B1 | 2/2003 | Thornton et al. | |
| 6,567,360 B1 | 5/2003 | Kagawa | |
| 6,593,673 B1 | 7/2003 | Sugai et al. | |
| 6,655,590 B1 | 12/2003 | McFeely et al. | |
| 6,672,514 B1 | 1/2004 | Brennan et al. | |
| 6,735,085 B2 | 5/2004 | McHugh et al. | |
| 6,881,077 B2 * | 4/2005 | Throum | H05K 5/0052 174/16.3 |
| 7,050,305 B2 * | 5/2006 | Thorum | H05K 5/0052 165/185 |
| 7,158,380 B2 | 1/2007 | Green et al. | |
| 7,187,553 B2 | 3/2007 | Schmidberger | |
| 7,203,065 B1 | 4/2007 | Sin Yan Too | |
| 7,215,551 B2 | 5/2007 | Wang et al. | |
| 7,265,984 B2 | 9/2007 | Numata | |
| 7,350,705 B1 | 4/2008 | Frederick et al. | |
| 7,362,578 B2 | 4/2008 | Hornung | |
| 7,450,387 B2 | 11/2008 | Cheng et al. | |
| 7,518,875 B2 | 4/2009 | Desrosiers et al. | |
| 7,791,874 B2 | 9/2010 | Reents et al. | |
| D631,449 S | 1/2011 | Ritter et al. | |
| 7,961,471 B2 * | 6/2011 | Odanaka | G06F 1/20 165/185 |
| 8,009,426 B2 | 8/2011 | Ahmad-Taylor et al. | |
| 8,278,880 B2 | 10/2012 | Nakajima et al. | |
| 8,620,162 B2 | 12/2013 | Mittleman | |
| 8,701,279 B2 | 4/2014 | Filson et al. | |
| 8,766,093 B2 | 7/2014 | Lee | |
| 8,773,858 B2 | 7/2014 | Burns | |
| 8,902,588 B2 * | 12/2014 | Ritter | H05K 7/20445 165/185 |
| 9,007,773 B2 * | 4/2015 | Warren | H05K 5/0013 165/80.2 |
| 2001/0026441 A1 | 10/2001 | Nakamura | |
| 2002/0039286 A1 | 4/2002 | Frank, Jr. et al. | |
| 2002/0051338 A1 | 5/2002 | Jiang et al. | |
| 2002/0154487 A1 | 10/2002 | Weischhoff Van Rijn | |
| 2003/0178627 A1 | 9/2003 | Marchl et al. | |
| 2005/0111195 A1 | 5/2005 | Wu | |
| 2005/0128710 A1 | 6/2005 | Beiteimal et al. | |
| 2005/0248923 A1 | 11/2005 | Hsu | |
| 2006/0067054 A1 | 3/2006 | Wang et al. | |
| 2006/0148295 A1 | 7/2006 | Reents et al. | |
| 2006/0181859 A1 * | 8/2006 | Thorum | H05K 5/0052 361/719 |
| 2006/0187643 A1 | 8/2006 | Tsurufusa | |
| 2006/0187645 A1 | 8/2006 | Numata | |
| 2006/0215357 A1 | 9/2006 | Green et al. | |
| 2007/0053513 A1 | 3/2007 | Hoffberg | |
| 2007/0058336 A1 | 3/2007 | Cheng | |
| 2007/0177356 A1 | 8/2007 | Panek | |
| 2008/0280482 A1 | 11/2008 | Huang | |
| 2009/0148638 A1 | 6/2009 | Kishi et al. | |
| 2010/0073881 A1 | 3/2010 | Williams | |
| 2010/0097768 A1 | 4/2010 | Ishii et al. | |
| 2011/0205710 A1 * | 8/2011 | Kondo | H05K 9/006 361/714 |
| 2012/0140417 A1 | 6/2012 | Aspas Puertolas et al. | |
| 2012/0243176 A1 | 9/2012 | Ritter et al. | |
| 2013/0347051 A1 | 12/2013 | Bose et al. | |

FOREIGN PATENT DOCUMENTS

| | | |
|---|---|---|
| CN | 1917755 | 2/2007 |
| CN | 201352820 Y | 11/2009 |
| CN | 201352820 Y | 11/2009 |
| CN | 201515429 | 6/2010 |
| CN | 201571126 U | 9/2010 |
| CN | 102714928 | 10/2012 |
| DE | 202005013758 | 1/2006 |
| EP | 0399763 B1 | 3/1997 |
| EP | 1248507 | 10/2002 |
| EP | 1511314 | 3/2005 |
| EP | 1610600 | 12/2005 |
| EP | 1990756 | 11/2008 |
| FR | 2875917 | 9/2004 |
| FR | 2871022 A1 | 12/2005 |
| GB | 2355017 | 4/2001 |
| GB | 2436170 | 9/2007 |
| JP | 61129349 | 8/1986 |
| JP | H6-227553 | 8/1994 |
| JP | 786471 | 3/1995 |
| JP | H7-59124 | 3/1995 |
| JP | 10-4281 | 1/1998 |
| JP | 104281 | 1/1998 |
| JP | 1065385 | 3/1998 |
| JP | H10-154390 | 6/1998 |
| JP | H11-233982 | 8/1999 |
| JP | 2000269671 | 9/2000 |
| JP | 2000269675 | 9/2000 |
| JP | 2001147061 | 5/2001 |
| JP | 2001284748 | 10/2001 |
| JP | 2001358482 | 12/2001 |
| JP | 2002134970 | 5/2002 |
| JP | 2002324989 | 11/2002 |
| JP | 2003017143 | 1/2003 |
| JP | 2004186294 | 7/2004 |
| JP | 2004363525 | 12/2004 |
| JP | 200505424 | 1/2005 |
| JP | 2005078642 | 3/2005 |
| JP | 2007208123 | 8/2007 |
| JP | 2008034474 | 2/2008 |
| JP | 2008131512 | 6/2008 |
| JP | 2009141160 | 6/2009 |
| WO | WO2007089321 | 8/2007 |
| WO | WO2007109216 | 9/2007 |
| WO | WO2009057124 | 5/2009 |
| WO | WO2010118071 A1 | 10/2010 |
| WO | WO2011071516 A1 | 6/2011 |
| WO | WO2011106082 A1 | 9/2011 |
| WO | WO2011146302 A1 | 11/2011 |

OTHER PUBLICATIONS

Kihara et al., "Infrared Sheds Light on New Uses for Remote Units", Journal of Electrical Engineering, vol. 27, No. 284, Aug. 1990, pp. 58-60.

McDermott, J., "Remote-control transmitter/receiver chips exhibit enhanced capabilities", Electrical Design News, vol. 27, No. 5, Mar. 1982, pp. 71-74.

* cited by examiner

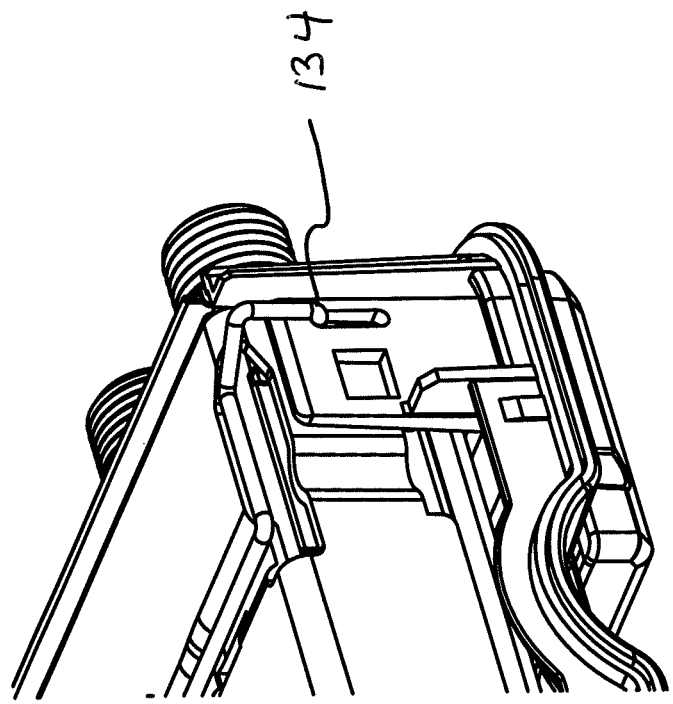
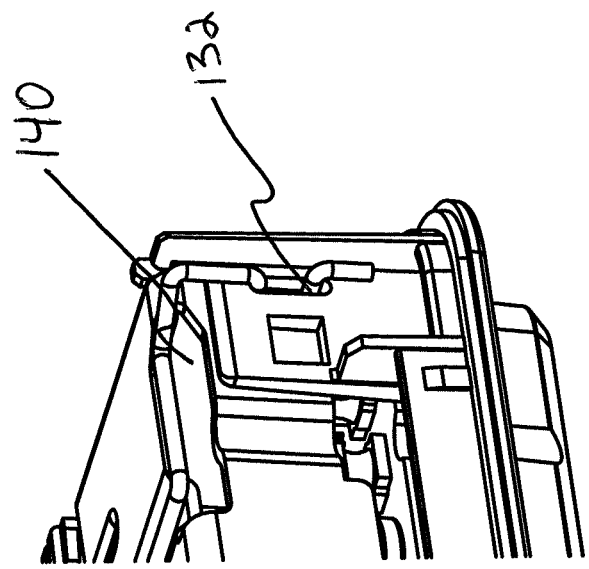
FIG 8

SET TOP BOX HAVING SNAP-IN HEAT SINK AND SMART CARD READER WITH A HOLD DOWN FOR RETAINING THE HEAT SINK

CROSS REFERENCE TO RELATED APPLICATIONS

This application claims the benefit, under 35 U.S.C. §365 of International Application PCT/US2012/046466, filed Jul. 12, 2012, which was published in accordance with PCT Article 21(2) on Jan. 17, 2013 in English and which claims the benefit of U.S. provisional patent application No. 61/572, 314, filed Jul. 14, 2011, and this application relates to PCT Application PCT/US2012/028000 filed Mar. 7, 2012.

FIELD OF INVENTION

The invention relates to a set top box, and more particularly, a set top box having a hold down for retaining a heat sink.

BACKGROUND

Thermal management remains a significant challenge in set top boxes. With the introduction of more components such as smart card readers and increased functionalities, which tend to produce more heat, the need for an improved thermal management system exists.

An additional complication in set top boxes is the need to reduce the size of set top boxes due to consumer preference. This trend for compactness also makes thermal management a challenge, because this greater compactness with an increase in the number of internal components generally results in a concentration of heat.

Proper thermal contact between a thermal pad on a circuit board and a heat sink improves heat dissipation from the circuit board. Existing means for securing the heat sink against the thermal pad result in undesirable rattling of the heat sink against the thermal pad and set top box. Additionally, existing securing means do not provide sufficient contact of the thermal pad with the heat sink.

Therefore, a need exists for a retainer to secure a heat sink in proper contact with the thermal pad and stabilize the heat sink to reducing rattling.

SUMMARY

A hold down for an electronic device is provided that urges a heat sink against a circuit board. The heat sink snaps into a bottom frame. The hold down includes a frame having retainers that match and engage slots in the bottom frame and the heat sink. The hold down provides a biasing force that urges the heat sink against the circuit board.

Embodiments of the invention provide a hold down for a set top box or the like that includes a bottom frame, a circuit board mounted above the bottom frame, a thermal pad mounted on the circuit board, and a heat sink associated with the thermal pad. The hold down can include a frame that defines a perimeter having a plurality of retainers that are configured to engage with a plurality of mating locations defined on at least a bottom frame to provide a biasing force that retains the heat sink against a circuit board that is positioned between the bottom frame and the hold down. The heat sink can include a planar portion surrounding a central depression portion and/or another depression portion. The hold down secures the thermal pad of the circuit board between the central depression portion and/or other portion of the heat sink and the circuit board. The hold down can include a plurality of wires that cross each other, which can be over or in the central depression. The plurality of wires can be dimensioned such that the biasing force is applied across a top surface of the heat sink. The plurality of wires can include central portions that extend downwards along an inner surface of the central depression portion of the heat sink. The heat sink can include grooves in the planar portion for receiving the wires. The heat sink can include a second central depression portion that contacts a second heat generating component on the circuit board. The bottom frame can include vertically extending portions on opposing sides having slots and the heat sink can include vertical extensions having clips that snap into the slots of the bottom frame, thereby securing the heat sink to the bottom frame. The retainers can include U-shaped or V-shaped contours that are received in the mating locations of the bottom frame and the heat sink. The retainers can include a first vertical portion, a lower horizontal portion, and second vertical portion that is received in the mating locations of the bottom frame and the heat sink.

Embodiments of the invention are directed to an electronic device comprising: a bottom frame, a circuit board mounted above the bottom frame, a thermal pad mounted on the circuit board, a heat sink associated with the thermal pad, and a hold down for providing a biasing force that retains the heat sink against the thermal pad. The hold down can comprise a frame that defines a perimeter having a plurality of retainers that are configured to engage with a plurality of mating locations defined on at least the bottom frame. The heat sink can include a planar portion surrounding a central depression portion and the hold down secures the thermal pad of the circuit board between the central depression portion of the heat sink and the circuit board. The hold down includes a plurality of wires that cross each other. The plurality of wires can be dimensioned such that the biasing force is applied across a top surface of the heat sink. The plurality of wires can include central portions that extend downwards along an inner surface of the central depression portion of the heat sink. The heat sink includes grooves in the planar portion for receiving the wires. The grooves can have a V or U profile to provide space for the hold down such that the hold down has no portion that is higher than the planar portion.

BRIEF DESCRIPTION OF THE DRAWINGS

A more detailed understanding of the invention may be had from the following description, in conjunction with the accompanying drawings, wherein:

FIG. 8 illustrates alternative retainers of the hold down; and

DETAILED DESCRIPTION OF THE PREFERRED EMBODIMENTS

Figure 1:
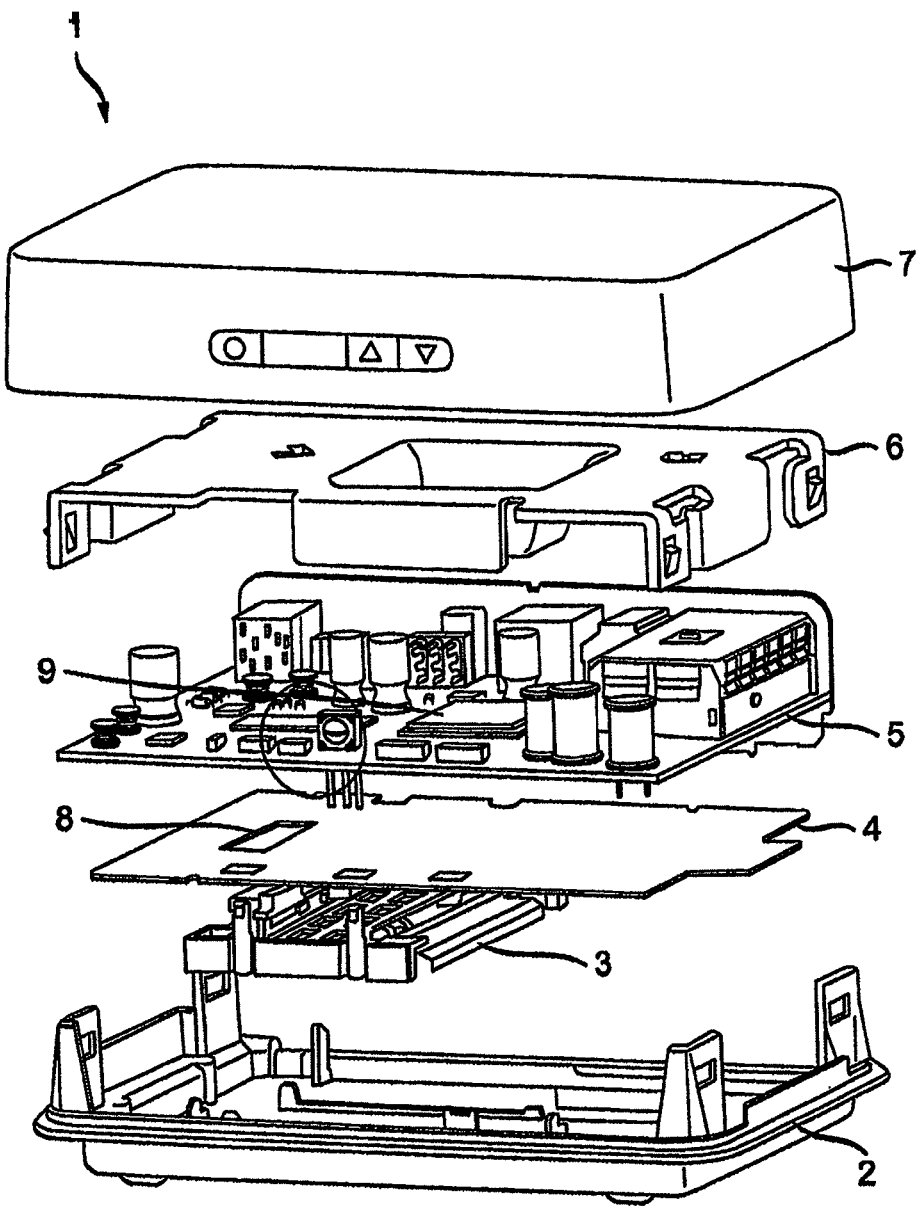
FIG. 1 is an exploded view of a set top box according to the prior art.

As illustrated in FIG. 1, a circuit board 5 is housed within a top cover 7 of a set top box 1. A thermal barrier 4 is positioned between the circuit board 5 and a bottom frame 2. A smart card reader 3 is connected to the circuit board 5 through an aperture 8 in the thermal barrier 4. The set top box 1 has internal components including the smart card reader 3, the thermal barrier 4, the circuit board 5, and a heat sink 6 that contacts the circuit board 5 and is positioned between the bottom frame 2 and the top cover 7. The thermal barrier 4 includes a thermal insulating material that preferably has substantially the same profile as the circuit board 5 or a profile that is at least 80% of the area profile of the circuit board 5. The thermal barrier 4 keeps the smart card reader 3 and other components under the circuit board 5 from overheating, in part, by preventing heat from transferring from the circuit board 5 and the components thereon.

The heat sink 6 is a heat dissipating feature that removes heat from the circuit board 5. The heat sink 6 has a top plan profile that completely covers the circuit board 5 or substantially covers the circuit board 5 such that at least 80% of the circuit board 5 is covered. The heat sink 6 may include a thermal pad 9. The heat sink 6 is a contoured plate that has a generally planar periphery 52 and a recessed feature such as a central depression 53 into a plane of the planar periphery 52, wherein the planar periphery 52 preferably surrounds the central depression 53. The central depression 53 has side walls extending from the planar periphery 52 and forming an obtuse angle therewith. The central depression 53 has a flat bottom that is designed to contact the circuit board 5, the heat generating components on the circuit board 5, and/or the thermal pad 9.

Figure 2:
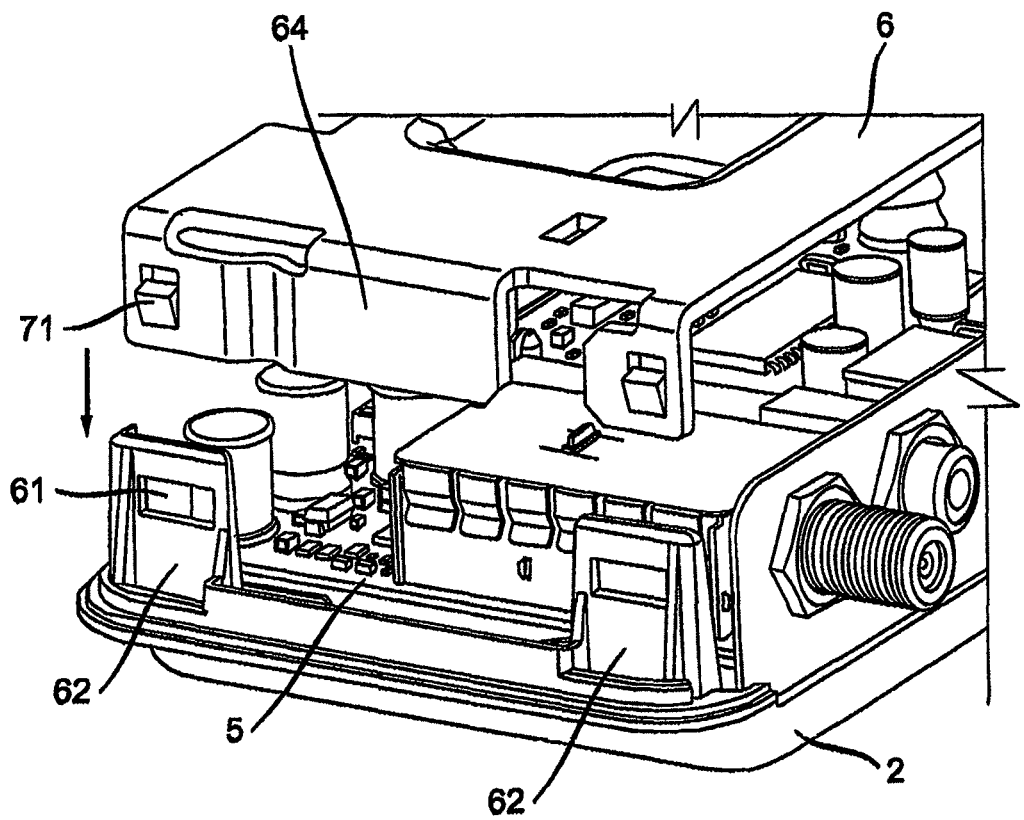
FIG. 2 is an enlarged view showing the heat sink of FIG. 1 prior to attachment with the bottom frame.

The heat sink 6 has vertical extensions 64 at the outer edges of the planar periphery 52 that are perpendicular to the planar periphery 52 and that extend over the circuit board 5 and contact the bottom frame 2 or vertically extending portions 62 of the bottom frame 2. The heat sink 6 attaches to the bottom frame 2 through slots and clips formed on these elements. The vertically extending portions 62 extend from the bottom frame 2 and have receiving slots 61 that are designed to receive clips 71 formed on the vertical extensions 64 of the heat sink 6. The vertically extending portions 62 may be plastic components, and as such, allow the heat sink clips 71 to elastically snap into the slots 61, thereby securing the heat sink 6 to the bottom frame 2. As illustrated in FIG. 2, the arrow indicates how the heat sink clips 71 are pressed downward onto the bottom frame slots 61.

Figure 3:
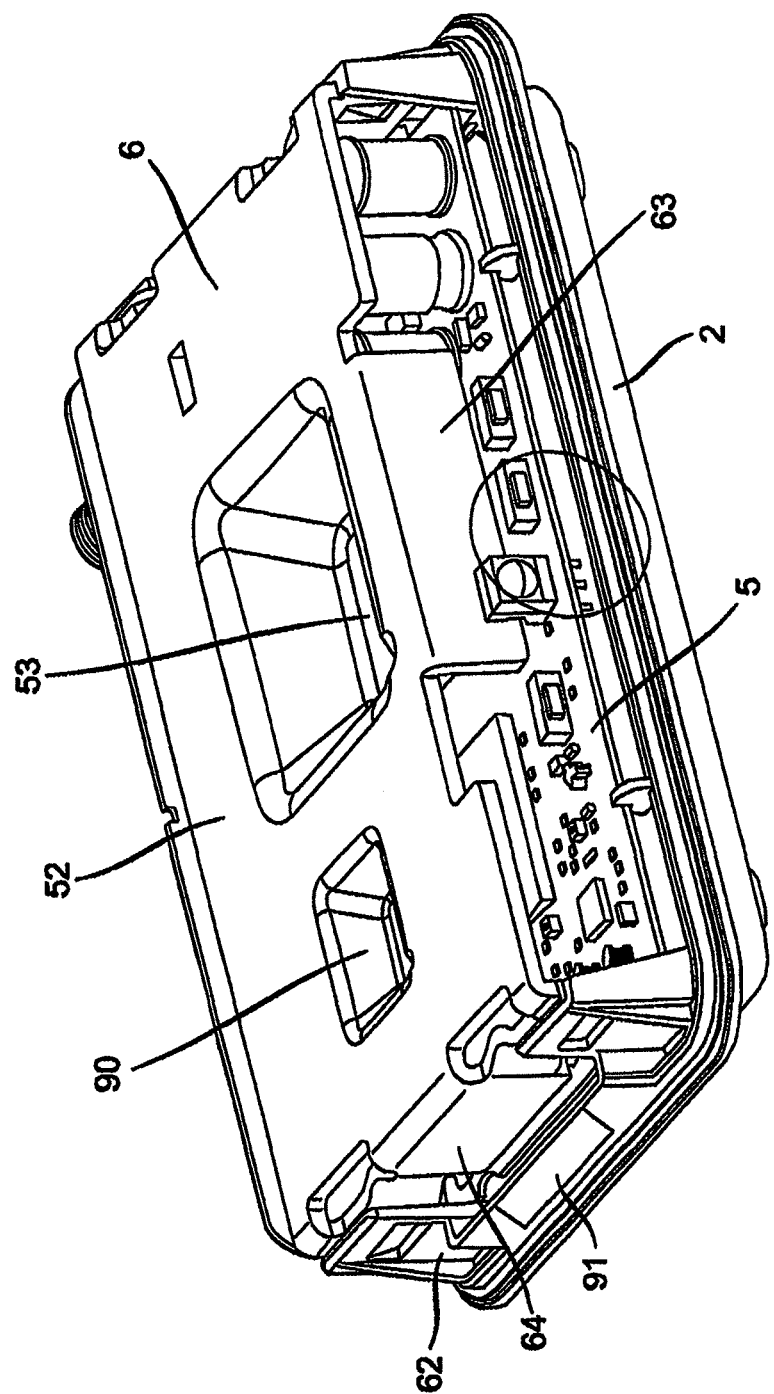
FIG. 3 illustrates the interior components of the set top box of FIGS. 1-2 with the heat sink attached to the bottom frame.

FIG. 3 is a perspective view of interior components of the set top box 1. The set top box 1 may include a second central depression 90 that contacts a secondary thermal pad 99 associated with the smart card reader 3. The bottom frame 2 may include a smart card access slot 91 below the circuit board 5 and one of the vertical extensions 64 of the heat sink 6. The slot 91 may also be between the vertically extending portions 62 of the bottom frame 2. The second central depression 90 thermally communicates with the smart card reader 3 through an aperture 8 in the circuit board 5 or the secondary thermal pad 99 through the circuit board 5.

Figure 4:
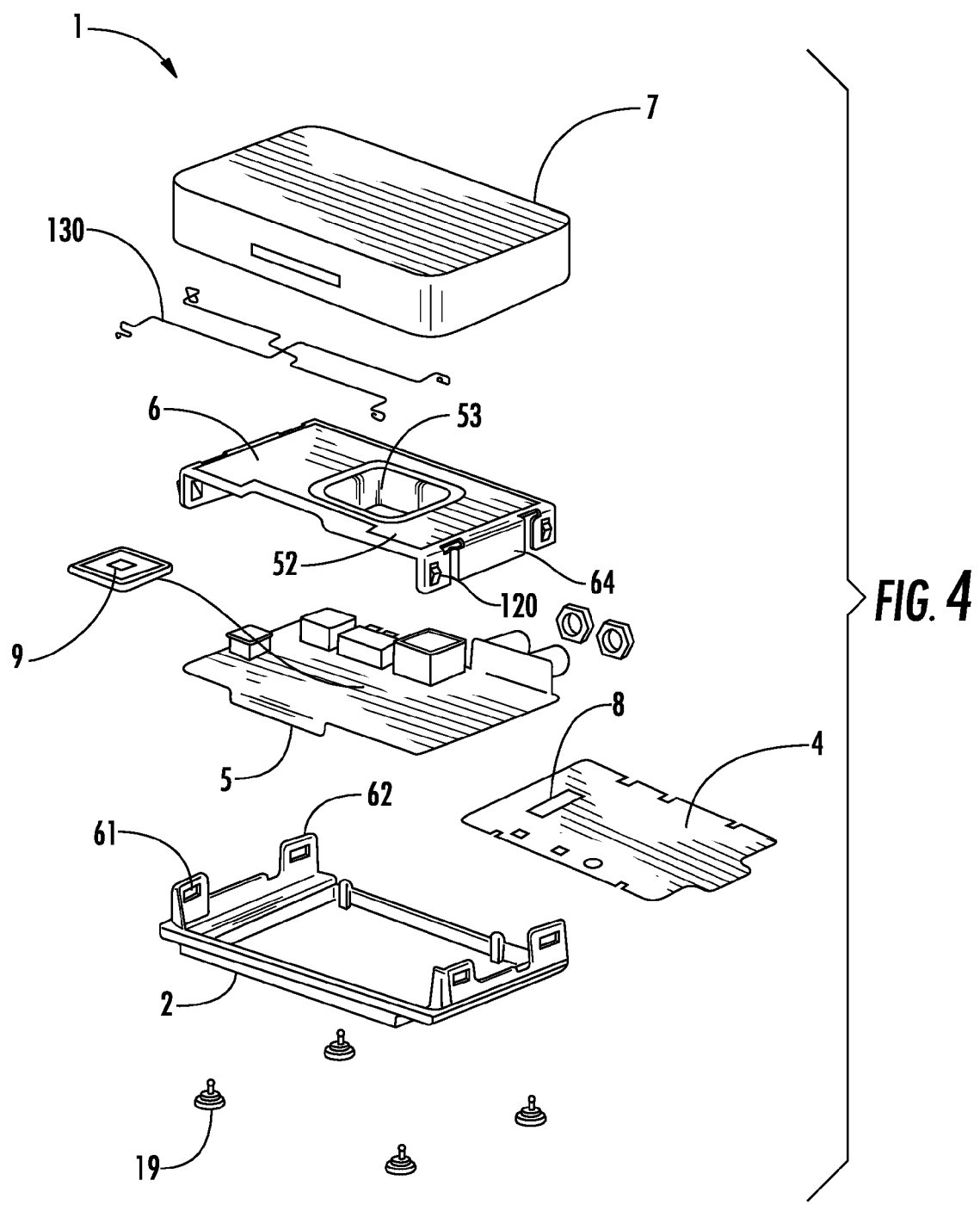
FIG. 4 is an exploded view of the set top box with the hold down.

The set top box 1 described in FIGS. 1-3 further includes a hold down 130 to secure the heat sink 6 against the circuit board 5. FIG. 4 shows an exploded view of the set top box 1 with the hold down 130. The hold down 130 includes a frame that defines a perimeter. The hold down 130 may be a rectangular frame that generally matches the shape of the heat sink 6. The perimeter of the hold down 130 includes retainers 103 arranged at the ends of the hold down 130. The retainers 103 are shaped to match and engage mating locations provided on at least the bottom frame 2. The heat sink 6 may also include mating locations for the retainers 103. The hold down 130 is preferably constructed from a rigid flexible material, such as a wire or multiple wires, preferably 304 stainless steel, that may extend diagonally to bias the heat sink 6 downwards against the thermal pad 9 and to provide contact between the circuit board 5, the thermal pad 9, and the central depression 53 of the heat sink 6 for proper thermal dissipation. The wires may cross each other such that one wire includes a bent portion that extends below the other wire. The region where the hold down components or wires cross can be centralized to be over the central depression and can inside the central depression. The hold down or wires can be applied to the prior art assemblies to enhance heat transfer to the heatsink.

The bottom surface of the central depression 53 and the circuit board 5 contact the thermal pad 9 on opposite sides and sandwich the thermal pad 9 between them. The hold down 130 improves the surface contact among these components.

The hold down 130 may be formed from a resilient material. The hold down 130 is preferably dimensioned such that the hold down 130 is tensioned when installed and exerts a biasing force across the top of the heat sink 6 or at a specific location on the heat sink 6 after the retainers 103 of the hold down 130 engage the mating locations of the bottom frame 2 and the heat sink 6.

Figure 9:
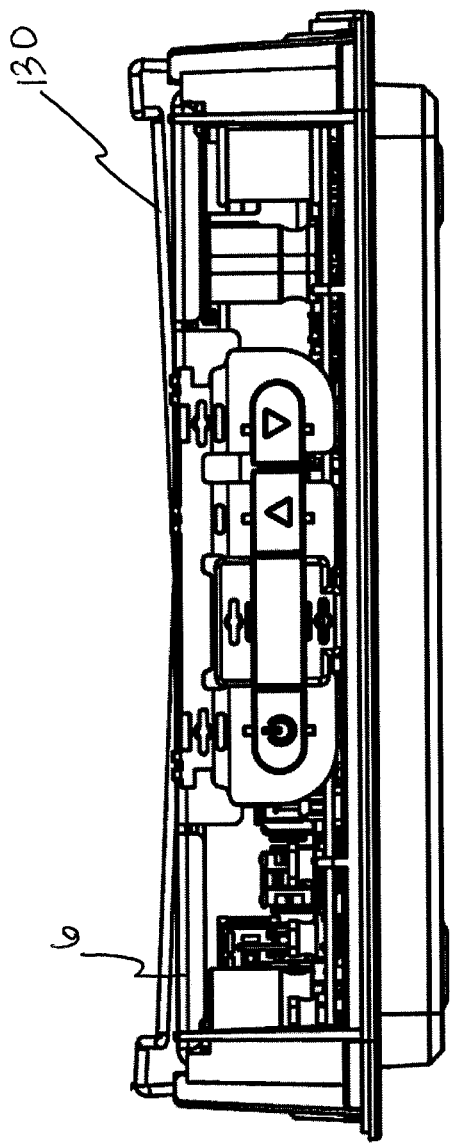
FIG. 9 illustrates the hold down including a bow in the downward direction.

The top surface of the heat sink 6 may define a longitudinal plane and the frame of the hold down 130 may extend in this plane or in a parallel plane. As shown in FIG. 9, when the hold down 130 engages the mating locations of the bottom frame 2 and the heat sink 6 and the hold down 130 engages the top surface of the heat sink 6, the heat sink 6 and the hold down 130 bows in the downward direction away from the initial plane or planes. The hold down 130 may also include end portions that rise vertically above the longitudinal plane of the heat sink 6. The extent of the hold down 130 between the end portions may bow downwardly to apply force to the heat sink 6. The hold down 130 may include a central portion that extends downward into the central depression 53 of the heat sink 6 and along the inner contours of the central depression 53 such that the hold down 130 is in further contact with the heat sink 6 and movement is further reduced. As compared to existing set top boxes, the hold down 130 allows for a thinner thermal pad 9 to be used because of the biasing force from the hold down 130 on the heat sink 6.

Figure 5:
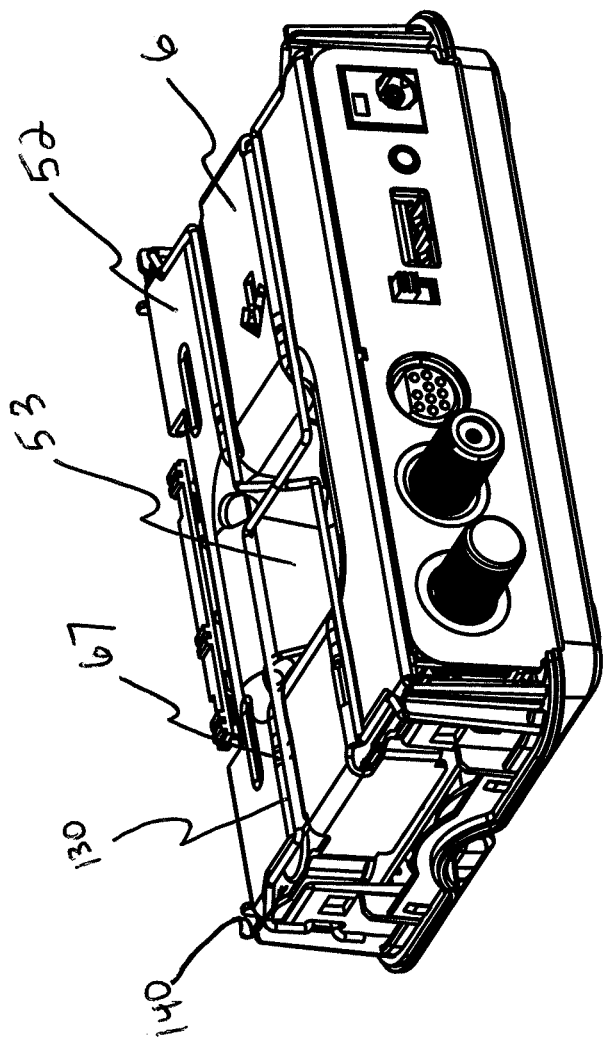
FIG. 5 illustrates grooves in the heat sink for engaging the hold down.

FIGS. 5-8 show various features of the set top box 1 and the hold down 130. The retainers 103 of the hold down 130 engage slots 92 formed on the vertically extending portions 62 of the bottom frame 2 and slots 120 formed on the vertical extensions 64 of the heat sink 6. FIG. 5 shows an assembled cutaway view of the set top box 1 with the hold down 130 pressing the central depression 53 of the heat sink 6 downward onto the thermal pad 9 on the circuit board 5. The heat sink 6 may include grooves 67 that are sufficiently deep to receive the hold down 130 and prevent the hold down 130 from protruding above the heat sink 6. The grooves 67 allow the vertical height of the set top box 1 to remain the same as compared to set top boxes without a hold down. The vertical extensions 64 of the heat sink 6 may also include cut out portions 140 that are shaped to receive portions of the hold down 130.

Figure 6:
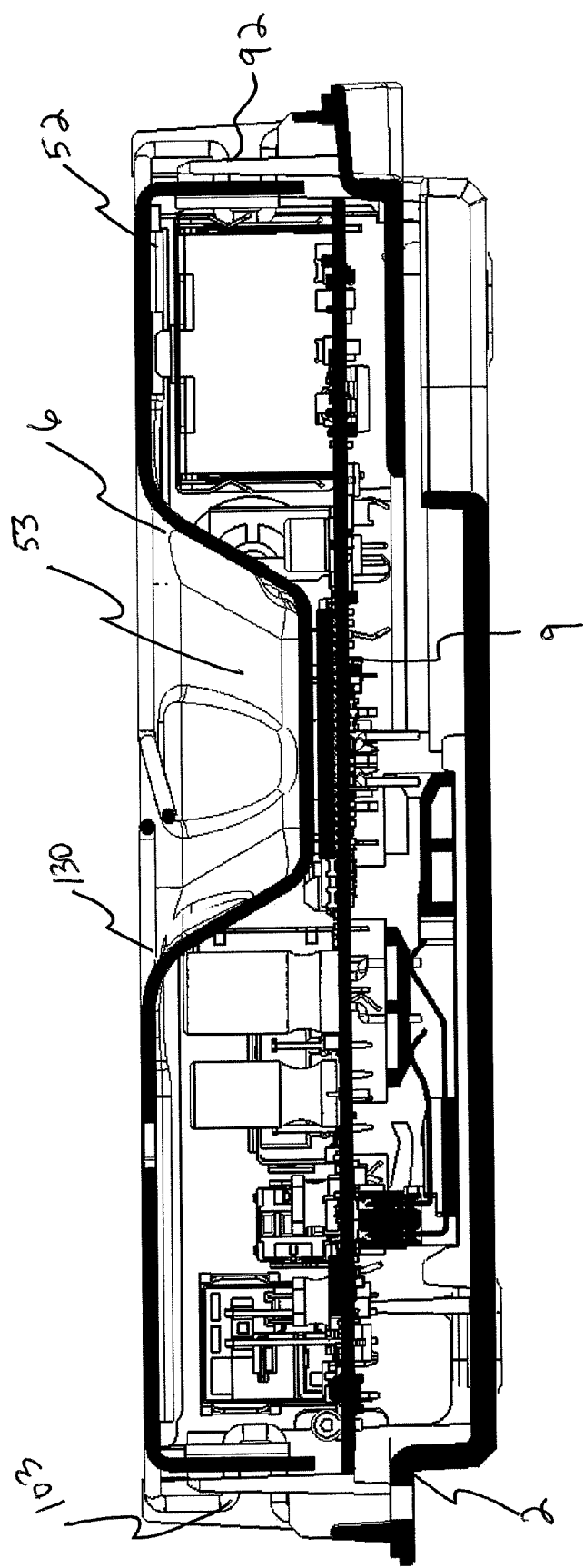
FIG. 6 illustrates how the hold down engages the top surface of the heat sink and the mating locations of the bottom frame.
Figure 7:
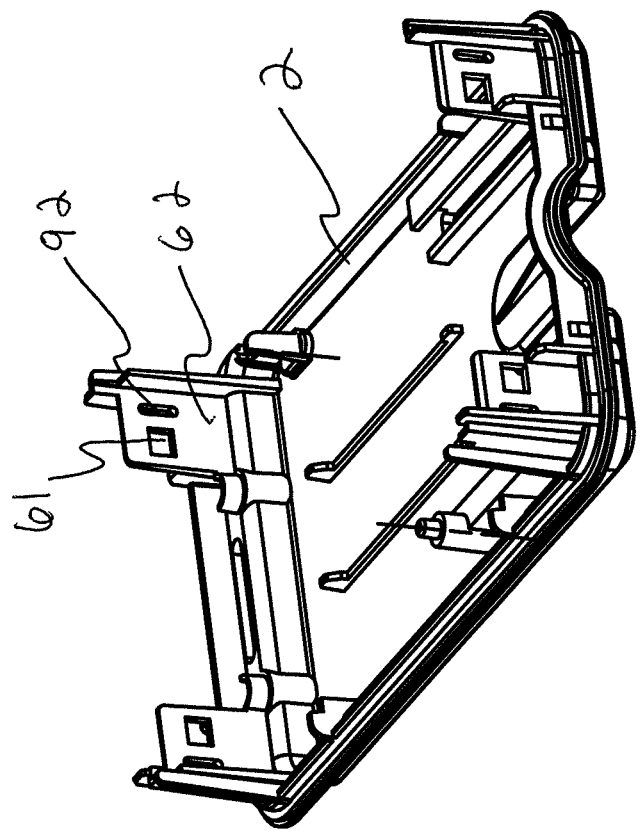
FIG. 7 illustrates the slots of the bottom cover.

FIG. 6 is sectional side view of the set top box 1 and illustrates the improved contact of the bottom surface of the central depression 53 with the thermal pad 9 as compared to existing set top boxes. FIG. 7 illustrates the slots 61 on the bottom frame 2 for receiving the clips 71 of the heat sink 6, and the slots 92 for receiving the retainers 103 at the ends of the hold down 130. FIG. 8 shows alternative embodiments of the retainers 103 of the hold down 130 and illustrates the retainers 103 may include any suitable end which secures the hold down 130 with the mating locations of the bottom frame 2 and the heat sink 6. The retainers 103 may include ends 132 with U-shaped or V-shaped inward contours that engage the slots 92 of the bottom frame 2 and the slots 120 of the heat sink 6. The retainers 103 may alternatively include ends 134 with a first vertical portion, a lower horizontal portion, and second vertical portion which engage the slots 92, 120 of the bottom frame 2 and heat sink 6. As noted above, the ends 132, 134 may engage the slots 92, 120 in such a way to tension the hold down 130.

The foregoing illustrates only some of the possibilities for practicing the invention. Many other embodiments are possible within the scope and spirit of the invention. It is, therefore, intended that the foregoing description be regarded as illustrative rather than limiting, and that the scope of the invention is given by the appended claims together with their full range of equivalents.

The invention claimed is:

1. A hold down for an electronic device that includes a bottom frame, a circuit board mounted above the bottom frame, a thermal pad mounted on the circuit board, and a heat sink associated with the thermal pad, wherein the hold down comprises:
    a frame that defines a perimeter having a plurality of retainers that are configured to engage with a plurality of mating locations defined on at least a bottom frame to provide a biasing force against a surface of the heat sink that retains the heat sink against a circuit board that is positioned between the bottom frame and the hold down.

2. The hold down of claim 1, wherein the heat sink includes a planar portion surrounding a central depression portion and the hold down secures the thermal pad of the circuit board between the central depression portion of the heat sink and the circuit board.

3. The hold down of claim 2, wherein the hold down includes a plurality of wires that cross each other.

4. The hold down of claim 3, wherein the plurality of wires are dimensioned such that the biasing force is applied across a top surface of the heat sink.

5. The hold down of claim 3, wherein the plurality of wires includes central portions that extend downwards along an inner surface of the central depression portion of the heat sink.

6. The hold down of claim 3, wherein the heat sink includes grooves for receiving the wires.

7. The hold down of claim 2, wherein the heat sink has a second central depression portion that contacts a second heat generating component on the circuit board.

8. The hold down of claim 1, wherein
    the bottom frame includes vertically extending portions on opposing sides having slots; and
    the heat sink includes vertical extensions having clips that snap into the slots of the bottom frame, thereby securing the heat sink to the bottom frame.

9. The hold down of claim 1, wherein the retainers include U-shaped or V-shaped contours that are received in the mating locations of the bottom frame and the heat sink.

10. The hold down of claim 1, wherein the retainers include a first vertical portion, a lower horizontal portion, and second vertical portion that is received in the mating locations of the bottom frame and the heat sink.

11. The hold down of claim 1, wherein the electronic device is a set top box.

12. An electronic device comprising:
    a bottom frame,
    a circuit board mounted above the bottom frame,
    a thermal pad mounted on the circuit board,
    a heat sink associated with the thermal pad, and
    a hold down for providing a biasing force against a surface of the heat sink that retains the heat sink against the thermal pad,
    wherein the hold down comprises:
    a frame that defines a perimeter having a plurality of retainers that are configured to engage with a plurality of mating locations defined on at least the bottom frame.

13. The electronic device of claim 12, wherein the heat sink includes a planar portion surrounding a central depression portion and the hold down secures the thermal pad of the circuit board between the central depression portion of the heat sink and the circuit board.

14. The electronic device of claim 13, wherein the hold down includes a plurality of wires that cross each other.

15. The electronic device of claim 14, wherein the plurality of wires are dimensioned such that the biasing force is applied across a top surface of the heat sink.

16. The electronic device of claim 15, wherein the plurality of wires includes central portions that extend downwards along an inner surface of the central depression portion of the heat sink.

17. The electronic device of claim 16, wherein the heat sink includes grooves in the planar portion for receiving the wires.

18. The hold down of claim 1, wherein the frame is a separate structure from the heat sink.

19. The electronic device of claim 12, wherein the hold down is a separate structure form the heat sink.

* * * * *